US012660650B2

(12) United States Patent
  Marin et al.

(10) Patent No.: US 12,660,650 B2
(45) Date of Patent: Jun. 16, 2026

(54) PACKAGE ARCHITECTURE WITH DIE-TO-DIE COUPLING USING GLASS INTERPOSER

(71) Applicant: Intel Corporation, Santa Clara, CA (US)

(72) Inventors: Brandon C. Marin, Gilbert, AZ (US); Gang Duan, Chandler, AZ (US); Jeremy Ecton, Gilbert, AZ (US); Suddhasattwa Nad, Chandler, AZ (US); Srinivas V. Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 49 days.

(21) Appl. No.: 17/937,519

(22) Filed: Oct. 3, 2022

(65) Prior Publication Data

US 2024/0113006 A1 Apr. 4, 2024

(51) Int. Cl.
  *H10W 70/65* (2026.01)
  *H10W 44/20* (2026.01)
  (Continued)

(52) U.S. Cl.
  CPC ........... *H10W 70/65* (2026.01); *H10W 44/20* (2026.01); *H10W 70/05* (2026.01); *H10W 70/093* (2026.01); *H10W 70/095* (2026.01); *H10W 70/611* (2026.01); *H10W 70/685* (2026.01); *H10W 70/695* (2026.01); *H10W 90/00* (2026.01); *H10W 90/401* (2026.01); *H10W 90/701* (2026.01); *H10W 44/209* (2026.01);
  (Continued)

(58) Field of Classification Search
  CPC ........... H01L 23/49838; H01L 21/4853; H01L 21/4857; H01L 21/486; H01L 23/145; H01L 23/49816; H01L 23/49822; H01L 23/49833; H01L 23/5381; H01L 23/5385; H01L 23/5386; H01L 23/66; H01L 24/16; H01L 25/0655; H10W 70/65; H10W 44/20; H10W 70/05; H10W 70/093; H10W 70/095; H10W 70/611; H10W 70/695; H10W 70/685
  See application file for complete search history.

(56) References Cited

U.S. PATENT DOCUMENTS

2014/0056554 A1     2/2014  Brunner et al.
2018/0158771 A1*   6/2018  Akiba ................... H01L 23/528
                  (Continued)

*Primary Examiner* — Michael Jung
(74) *Attorney, Agent, or Firm* — Akona IP PC

(57) ABSTRACT

Embodiments of a microelectronic assembly comprise: an interposer structure of glass, a substrate comprising organic dielectric material, the substrate coupled to a first side of the interposer structure; and a plurality of IC dies. A first IC die in the plurality of IC dies is coupled to the substrate by first interconnects, a second IC die in the plurality of IC dies is embedded in the organic dielectric material of the substrate, the second IC die is coupled to the first IC die by second interconnects, the second IC die is coupled to the first side of the interposer structure by third interconnects, and a third IC die in the plurality of IC dies is coupled to a second side of the interposer structure by fourth interconnects, the second side of the interposer structure being opposite the first side of the interposer structure.

13 Claims, 6 Drawing Sheets

(51) Int. Cl.

| | | |
|---|---|---|
| *H10W 70/05* | (2026.01) | |
| *H10W 70/60* | (2026.01) | |
| *H10W 70/685* | (2026.01) | |
| *H10W 70/695* | (2026.01) | |
| *H10W 90/00* | (2026.01) | |

(52) U.S. Cl.

CPC ........ *H10W 44/216* (2026.01); *H10W 90/722* (2026.01); *H10W 90/724* (2026.01)

(56) References Cited

U.S. PATENT DOCUMENTS

| | | | |
|---|---|---|---|
| 2020/0211969 A1 | 7/2020 | Hossain et al. | |
| 2021/0193637 A1 | 6/2021 | Jeng et al. | |
| 2021/0358855 A1 | 11/2021 | Strong et al. | |
| 2023/0063304 A1* | 3/2023 | Liu ...................... | H01L 23/145 |
| 2023/0395515 A1* | 12/2023 | Hsu .................... | H01L 21/4857 |
| 2023/0395519 A1* | 12/2023 | Yew .................... | H01L 23/3121 |
| 2024/0105699 A1* | 3/2024 | Dabral .............. | H01L 23/49816 |

* cited by examiner

PACKAGE ARCHITECTURE WITH DIE-TO-DIE COUPLING USING GLASS INTERPOSER

TECHNICAL FIELD

The present disclosure relates to techniques, methods, and apparatus directed to a package architecture with die-to-die coupling using glass interposers.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figures 1A, 1B, 2:
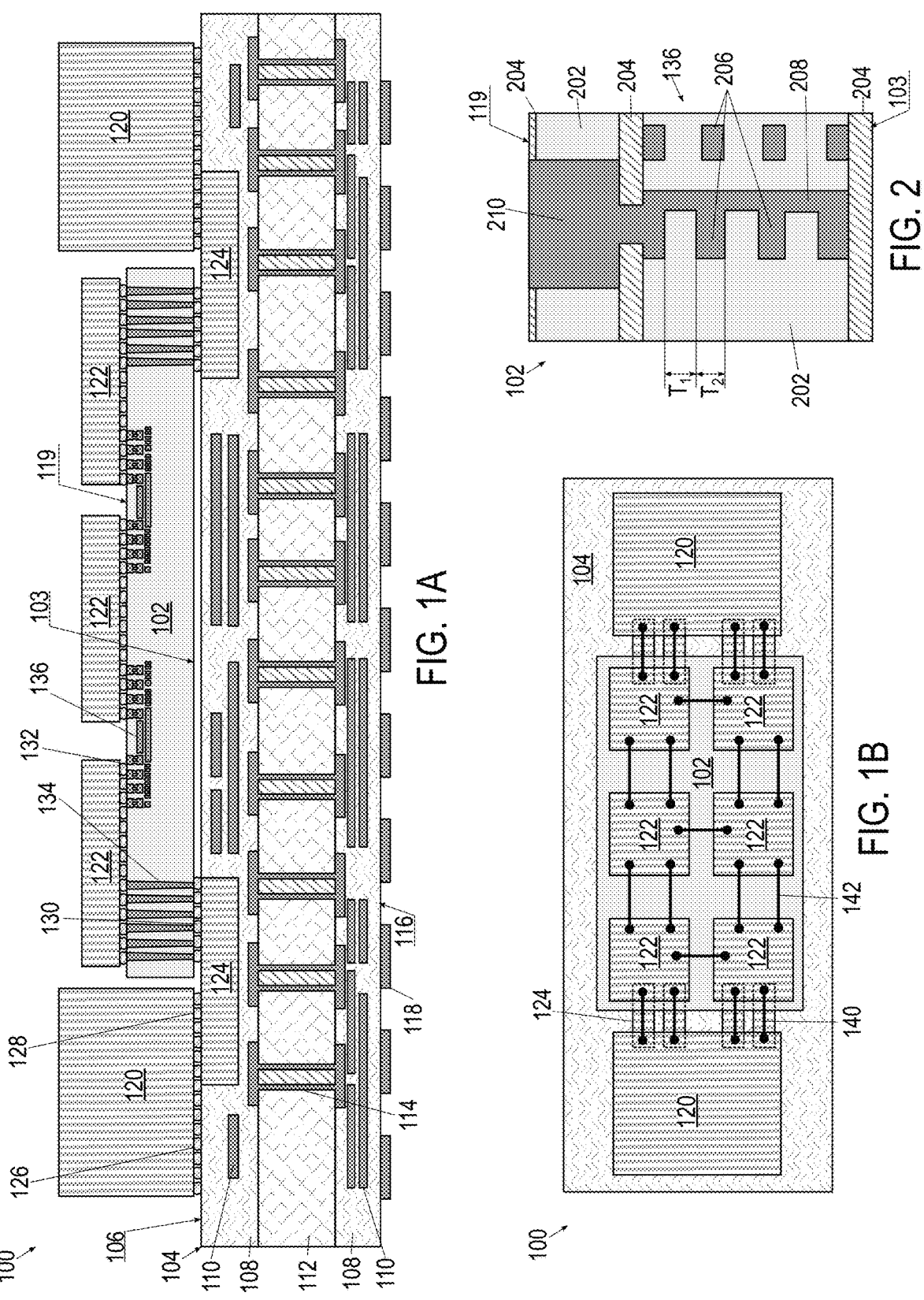
FIG. 1A is a schematic cross-sectional views of an example microelectronic assembly according to some embodiments of the present disclosure.
FIG. 1B is a schematic top view of the microelectronic assembly of FIG. 1A.
FIG. 2 is a schematic cross-sectional view of a portion of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

As Moore's law nears its natural limits, supercomputing faces inherent physical problems in moving toward zettascale systems. Zettascale computing aims to create 1000× the current level of compute today in or around the latter half of the decade, to take advantage of high demand for computational resources by both consumers and businesses, and to implement data hungry applications, such as artificial intelligence, machine learning and such. Zettascale supercomputers are targeted to have computing performance in the order of one zettaflops. One zettaflops equals one thousand exaflops, or one sextillion floating point operations per second. Despite advances in semiconductor processing and logic design that have permitted an increase in the amount of logic circuits that may be included in processors and other IC devices, signal speeds reach physics-based bottlenecks to achieve zettascale performance, for example, from the inherent limitations of the materials used for signal propagation, such as copper in a dielectric medium, heat transfer challenges from high intensity computations, and power delivery constraints to power several thousand simultaneous computations in multiple processors.

Many processors used in current supercomputers and other processing devices already have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer. Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

Consequently, the trend in the processor industry is to move toward disaggregation, using multiple known good chiplets (smaller sized IC dies) made using different manufacturing technologies and assembling them together into one microprocessor using novel bonding techniques. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-chip (SOC). In other words, the individual dies are connected to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a USB controller, which is built to meet certain universal serial bus (USB) standards, rather than for processing speed. Thus, by having different parts of the overall design separated into different dies, each one optimized in terms of design and manufacturing, the overall yield and cost of the combined die solution may be improved.

The connectivity between these dies is achievable by many ways. For example, in 2.5D packaging solutions, a silicon interposer and through-silicon vias (TSVs) connect dies at silicon interconnect speed in a minimal footprint. In some such architecture, bridge dies are also used to provide lateral connectivity between adjacent IC dies. In another example, a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The bridge and the 3D stacked architecture may also be combined to allow for top-packaged chips to communicate with other chips horizontally using the bridge and vertically, using Through-Mold Vias (TMVs) which are typically larger than TSVs. However, these current interconnect technologies use silicon-based interposers, which can be costly, or organic interposers, which can be error prone and not amenable to fine pitch interconnections.

Accordingly, embodiments described herein enable a microelectronic assembly that includes: an interposer structure of glass, a substrate comprising organic dielectric material, the substrate coupled to a first side of the interposer structure; and a plurality of IC dies. A first IC die in the plurality of IC dies is coupled to the substrate by first interconnects, a second IC die in the plurality of IC dies is embedded in the organic dielectric material of the substrate, the second IC die is coupled to the first IC die by second interconnects, the second IC die is coupled to the first side of the interposer structure by third interconnects, and a third IC die in the plurality of IC dies is coupled to a second side of the interposer structure by fourth interconnects, the second side of the interposer structure being opposite the first side of the interposer structure.

Various other embodiments of microelectronic assembly disclosed herein comprise a package substrate including: an interposer layer comprising glass; and a substrate layer on a first side of the interposer layer, the substrate layer comprising organic dielectric material; and a plurality of IC dies coupled to a second side of the interposer layer by interconnects, the second side being opposite the first side. The IC dies in the plurality of IC dies are conductively coupled to each other by first conductive structures in the interposer layer, the substrate layer comprises second conductive structures in the organic dielectric material, and TGVs in the interposer layer conductively couple the plurality of IC dies to the second conductive traces.

Embodiments disclosed herein further include a method comprising: providing a substrate comprising a plurality of layers of conductive traces in an organic dielectric material; attaching an interposer structure comprising glass to the substrate; attaching a plurality of IC dies to the interposer structure; and conductively coupling the plurality of IC dies through the interposer structure.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a noncrystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "optical structure" includes arrangements of forms fabricated in ICs to receive, transform and/or transmit optical signals as described herein. It may include optical conductors such as waveguides, electromagnetic radiation sources such as lasers and light-emitting diodes (LEDs) and electro-optical devices such as photodetectors.

In various embodiments, any photonic IC (PIC) described herein may comprise a semiconductor material including, for example, N-type or P-type materials. The PIC may include, for example, a crystalline base material formed using a bulk silicon (or other bulk semiconductor material) or a SOI structure (or, in general, a semiconductor-on-insulator structure). In some embodiments, the PIC may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group Ill-N or group IV materials. In some embodiments, the PIC may comprise a non-crystalline material, such as polymers. In some embodiments, the PIC may be formed on a printed circuit board (PCB). In some embodiments, the PIC may be inhomogeneous, including a carrier material (such as glass or silicon carbide) as a base material with a thin semiconductor layer over which is an active side comprising transistors and like components. Although a few examples of the material for the PIC are described here, any material or structure that may serve as a foundation upon which the PIC may be built falls within the spirit and scope of the present disclosure.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In silicon-on-insulator, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc.

In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle inter-metallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
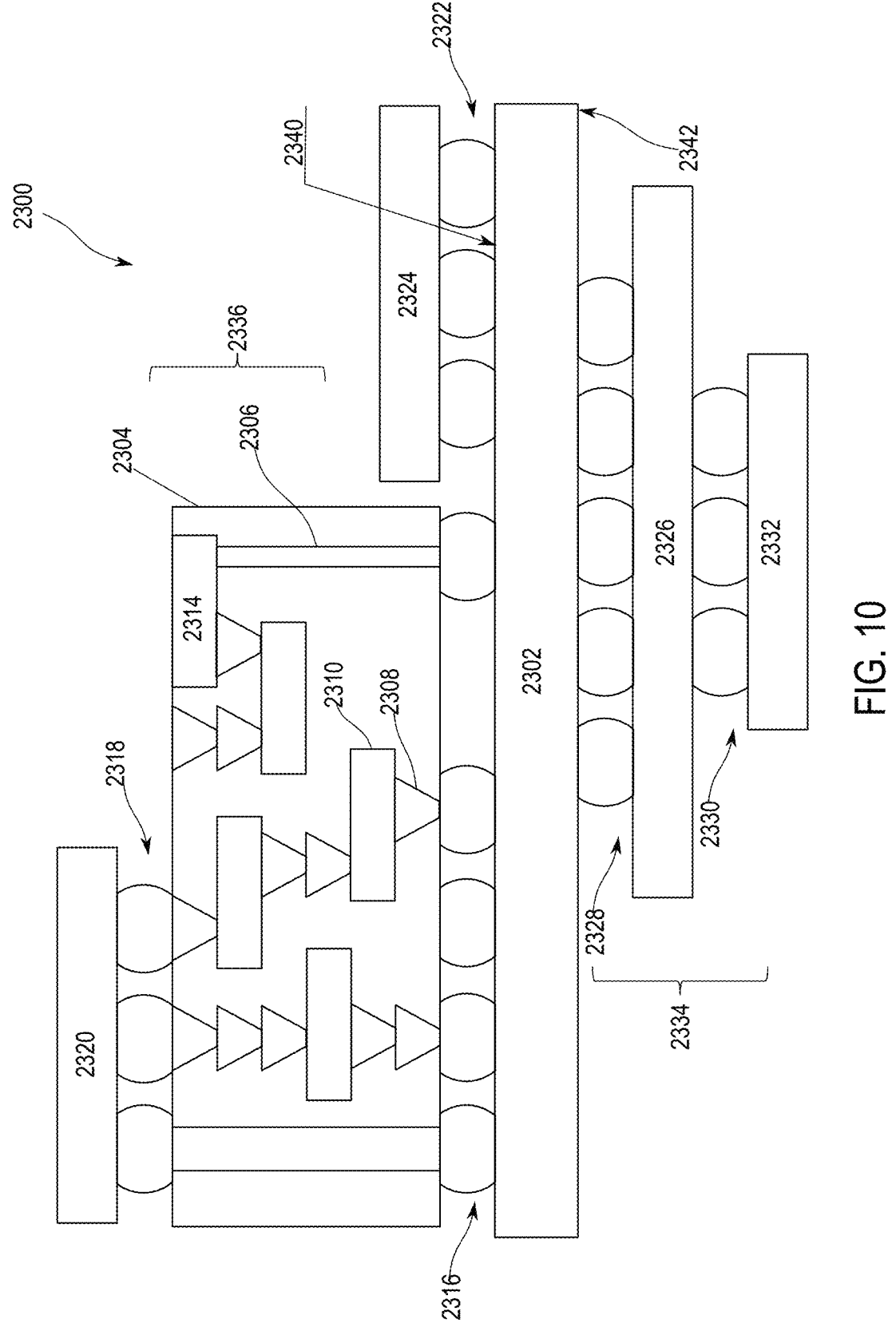
FIG. 10 is a cross-sectional side view of a device assembly that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1A is a schematic cross-sectional view of an example microelectronic assembly 100 according to some embodiments of the present disclosure. Microelectronic assembly 100 comprises an interposer structure 102 comprising glass. In some embodiments, the glass may comprise borosilicate glass, for example, comprising silica (e.g., 52%-56%), alumina (e.g., 12%-16%), borate (e.g., 5%-10%), calcinate (e.g., 16%-25%), and magnesium oxide (e.g., 0%-6%). In some embodiments, the glass may have a composition to enable a low coefficient of thermal expansion (CTE), for example, around 2.8 PPM/C; in some such embodiments, the glass may comprise approximately 60%-65% silica and 20%-25% alumina. In some other embodiments, the glass may have a composition to enable low electrical loss, for example, with dielectric constant around 4.8 at 1 GHz and 4.69 at 10 GHz, and loss tangent of 0.0043 at 1 GHz; in some such embodiments, the glass may comprise approximately 52%-56% silica, 10%-15% alumina, 15%-20% borate, 0%-10% calcinate, and 0%-5% magnesium oxide.

A side 103 of interposer structure 102 may be attached to a substrate 104 on a side 106 of substrate 104. Substrate 104 comprises buildup layers having an organic dielectric material 108 with conductive structures 110 therein. In some embodiments, conductive structures 110 comprise bondpads, conductive traces and conductive vias. In some embodiments, a plurality of layers of conductive traces may be present, each layer separated by organic dielectric material 108 and conductively coupled to each other by conductive vias. Only some such structures are shown in the figure for ease of illustration and so as not to clutter the drawing. Any suitable configuration of conductive structures 110 may be disposed in substrate 104 within the broad scope of the embodiments. In some embodiments, substrate 104 may comprise a core 112 having a different composition than organic dielectric material 108; for example, organic dielectric material 108 may comprise polyimide and core 112 may comprise fiber reinforced epoxy. In some other embodiments, organic dielectric material 108 may comprise one type of epoxy and core 112 may comprise a different type of epoxy. Any suitable organic material typically used in package substrates and as enumerated in the previous subsection may be comprised in organic dielectric material 108 and/or core 112 in substrate 104 within the broad scope of the embodiments.

In some embodiments, substrate 104 may comprise buildup layers having organic dielectric material 108 with conductive structures 110 therein on either side of core 112. In some such embodiments, through-hole vias (THVs) 114 through core 112 provide conductive coupling of conductive structures 110 on either side of core 112. Side 116 is opposite side 106 of substrate 104 and may comprise bond-pads 118 that may be configured for coupling substrate 104 to a motherboard or socket of a motherboard.

In various embodiments, side 119 of interposer structure 102 may be parallel to and opposite side 103 and coupled to one or more of various IC dies. For example, different IC dies 120, 122, and 124 may be present in microelectronic assembly 100. In the drawing, each of IC dies 120 is represented as a single block, but actually, may comprise a single IC die, or a stack of IC dies arranged one on top of another, or a multi-chip package. In some embodiments, IC dies 120 may comprise memory circuits, for example, high-bandwidth memory (HBM). In some embodiments, IC dies 120 may comprise semiconductor dies made using older technologies. IC dies 122 may comprise compute dies, for example, fabricated on the latest semiconductor technology node, or other such advanced process technologies. In general, a transistor in IC die 120 may be larger than a transistor in IC die 122. Die sizes may also differ: IC dies 120 may be larger in footprint (and thickness) than any one IC dies 122. In some embodiments, IC die 120 may vary between 100-700 square millimeters in area with thicknesses ranging between 100 and 2000 micrometers; in some embodiments, IC die 122 may vary between 25-500 square millimeters in area with thicknesses ranging between 5 and 500 micrometers. IC dies 124 may comprise bridge circuits, serving to conductively couple IC dies 120 with IC dies 122. Thus, IC dies 124 may also be referred to herein as "bridge dies 124." In some embodiments, interposer structure 102 may comprise active circuit elements that can be fabricated using appropriate complementary metal oxide semiconductor (CMOS) processes on glass substrates.

In various embodiments IC dies 120 may be directly coupled to substrate 104 by conductive interconnects 126 having a pitch in a range between 10 micrometers and 200 micrometers. IC dies 120 may be conductively coupled to IC dies 124 by interconnects 128, having the same pitch as interconnects 126, or a different pitch in a range between 10 micrometers and 135 micrometers. IC dies 124 may be conductively coupled to interposer structure 102 by interconnects 130. IC dies 122 may be conductively coupled to side 119 of interposer structure 102 by interconnects 132. In many embodiments, interconnects 126, 128, 130, and 132 may comprise DTD interconnects as described in the previous subsection. Interconnects 130 on side 103 of interposer structure 102 and interconnects 132 on side 119 of interposer structure 102 may be conductively coupled together by through-glass vias (TGVs) 134. Further, two or more IC dies 122 on side 119 of interposer structure 102 may be conductively coupled together by conductive structures 136 in interposer structure 102.

FIG. 1B is a schematic top view of example microelectronic assembly 100 of FIG. 1A. Note that only a few components are shown; such is merely for ease of illustration, and is not intended as a limitation. Any number of components (e.g., IC dies) may be included in microelectronic assembly 100 within the broad scope of the embodiments. Portion of IC die 124 are shown as dotted to indicate that the dotted portions are underneath the overlying structures (e.g., IC dies 120 and 122).

IC die 120 may be coupled by a conductive pathway 140 to IC die 122. Note that conductive pathway 140 may comprise numerous conductive traces, conductive vias and more than one interconnect 128, 130, and 132 in various embodiments. Conductive pathway 140 shown is merely conceptually representational and is not intended to be an accurate physical or geometric representation. Conductive pathway 140 may be through IC die 124 in substrate 104. Conductive pathway 140 may include interconnects 128 between IC dies 120 and 124, conductive traces and vias in IC die 124, interconnects 130 between IC die 124 and interposer structure 102, TGVs 134, and interconnects 132 between IC die 122 and interposer structure 102.

IC dies 122 on interposer structure 102 may be conductively coupled by conductive pathway 142. Note that conductive pathway 142 may comprise numerous conductive traces, conductive vias and more than one interconnect 132 in various embodiments. In some embodiments, conductive pathway 142 may be optical waveguides, enabling optical communication between IC dies 122. Conductive pathway 142 shown is merely conceptually representational and is not intended to be an accurate physical or geometric representation. Conductive pathway 140 may include interconnects 132 between IC dies 122 and interposer structure 102, and conductive structures 136 in interposer structure 102. In various embodiments, IC dies 122 may form a compute array on interposer structure 102, communicating with memory circuits provisioned in IC dies 120 through bridge dies 124. In some embodiments, one or more IC dies 120 may also comprise peripheral interconnect circuits, for example, to enable communication with another component or microelectronic assembly.

Note that although conductive pathways 140 and 142 are shown between adjacent IC dies, such conductive pathways may extend to non-adjacent IC dies as well within the broad scope of the embodiments. For example, two of IC dies 120 may be conductively coupled across IC dies 122 (and other components not shown in the figure) by suitable conductive pathways in interposer structure 102 and more than one bridge die 124.

FIG. 2 is a schematic cross-sectional view of a portion of an example microelectronic assembly 100 according to some embodiments of the present disclosure. The portion shown is part of interposer structure 102, indicating example conductive structures 136 therein. Interconnect structure 102 comprises a glass material 202. In some embodiments, interconnect structure 102 may be fabricated in sequential layers of glass material 202 (e.g., silicon oxide along with other elements, such as borate, etc.), along with layers 204 of other materials. For example, sides 103 and 119 of interposer structure 102 may be coated with layer 204 comprising silicon nitride predominantly. Choice of materials for layers in interconnect structure 102 may be based on manufacturing, operational and other considerations beyond the scope of the present disclosure.

In various embodiments, conductive structures 136 comprise conductive traces 206, conductive vias 208 and conductive bond-pads 210. Conductive traces 206 may be disposed in a plurality of layers in interconnect structure 102, with conductive vias 208 conductively coupling conductive traces 206 in different layers. In some embodiments, each layer may be approximately 3 microns thick. In other embodiments, each layer may be approximately 1.2 microns thick. For example, conductive vias 208 may be in a layer that has a thickness $T_1$; conductive traces 206 may be in an adjacent layer that has a thickness $T_2$. In some embodiments, $T_1$ may be the same as $T_2$; in other embodiments, $T_1$ may not be the same as $T_2$. In some embodiments (as shown), conductive traces 206 proximate to side 103 of interposer structure 102 is approximately of same thickness as conductive traces 206 proximate to bond-pads 210 and side 119 of interposer structure 102.

Spacing between conductive traces 206 and width of conductive traces 206 in any one layer may vary according to the thickness of the respective conductive traces 206 in the same layer. In some embodiments, the line spacing of conductive traces 206 may be 1 micrometer, and in other embodiments, the line spacing of conductive traces 206 may be 20 micrometers. Via spacing (e.g., between TGVs 134 and/or conductive vias 208) may vary between 2 microns and 15 microns in different embodiments. Via diameter (e.g., of TGVs 134 and/or conductive vias 208) may vary between 2 micrometers in some embodiments, and 50 micrometers in other embodiments.

The number of layers of conductive traces 206 may vary depending on factors beyond the scope of the disclosure. In some embodiments (as shown), the layers in some portions of interposer structure 102 may extend through the thickness of interposer structure 102 between sides 103 and 119. In some other embodiments (not shown), the layers may extend partially through the thickness of interposer structure 102. In some embodiments, conductive structures 136 may extend partially through the thickness in some portions of interposer structure 102 and entirely through the thickness in some other portions of interposer structure 102. In some embodiments (not shown), conductive traces 206 may be conductively coupled to TGVs 134 suitably. In various embodiments, the total thickness of interposer structure 102 may depend on the number of layers of conductive traces 206; in other embodiments, the thickness may be invariant to the number of layers of conductive traces 206 (for example, an increase in number of layers may be offset by a reduced length of TGV 134, and/or other configuration options). In some embodiments, interposer structure 102 may vary in thickness between 100 micrometers in some embodiments and 1000 micrometers in other embodiments.

In some embodiments, the thickness of layer 204 may vary between 0.4 microns to 2.7 microns. In some embodiments, layer 204 may be present between conductive bond-pads 210 and conductive trace 206. In such embodiments, a subset of conductive vias 208 may be through such layer 204. Conductive bond-pads 210 may be approximately 6 microns thick in some embodiments. In some embodiments, the size and thickness of conductive bond-pads 210 may vary according to the type of interconnects 126, 128, 130 and/or 132.

Figure 3:
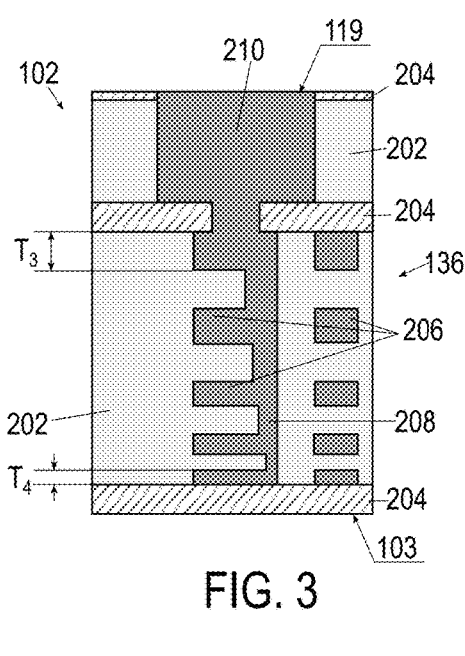
FIG. 3 is a schematic cross-sectional view of a portion of an example microelectronic assembly according to some other embodiments of the present disclosure.

FIG. 3 is a schematic cross-sectional view of a portion of an example microelectronic assembly 100 according to some embodiments of the present disclosure. The features of the embodiment shown are substantially the same as those in FIG. 2, except that the thickness of various layers of conductive traces 206 and conductive vias 208 vary between sides 103 and 119 of interposer structure 102. In the embodiment shown, thickness $T_3$ of conductive trace 206 proximate to side 103 may be smaller than thickness $T_4$ of conductive trace proximate to side 119. In some embodiments (as shown), the layers in some portions of interposer structure 102 may extend through the thickness of interposer structure 102 between sides 103 and 119. Spacing between conductive traces 206 and width of conductive traces 206 in any one layer may vary according to the thickness of the respective conductive traces 206 in the same layer, as described in more detail in reference to FIG. 2.

The number of layers of conductive traces 206 may vary depending on factors beyond the scope of the disclosure. In some embodiments (as shown), the layers in some portions of interposer structure 102 may extend through the thickness of interposer structure 102 between sides 103 and 119. In some other embodiments (not shown), the layers may extend partially through the thickness of interposer structure 102. In some embodiments, conductive structures 136 may extend partially through the thickness in some portions of interposer structure 102 and entirely through the thickness in some other portions of interposer structure 102. In some embodiments (not shown), conductive traces 206 may be conductively coupled to TGVs 134 suitably.

Figure 4:
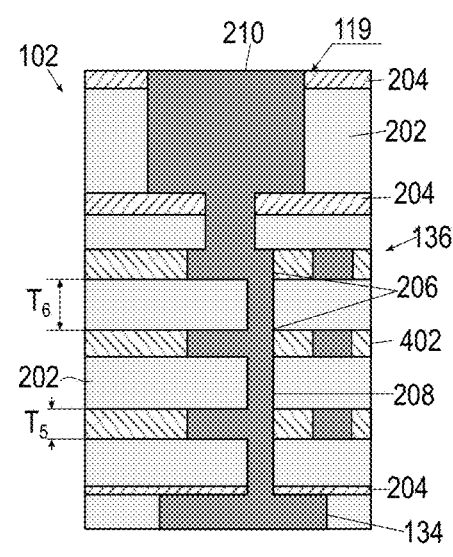
FIG. 4 is a schematic cross-sectional view of a portion of another example microelectronic assembly according to some other embodiments of the present disclosure.

FIG. 4 is a schematic cross-sectional view of a portion of an example microelectronic assembly according to some embodiments of the present disclosure. The features of the embodiment shown are substantially the same as those in FIG. 2, except that conductive traces 206 may be disposed in a layer of a glass material 402 different from glass material 202. For example, glass material 402 may comprise carbon-doped silica in some embodiments. Layers of glass material 202 may alternate with layers of glass material 402 such that conductive traces 206 are disposed in layers of glass material 402 and conductive vias 208 are disposed in layers of glass material 202. In some embodiments, layers of glass material 402 may be of a different thickness than layer of glass material 202. For example, thickness $T_5$ of layer of glass material 202 may be larger than thickness $T_6$ of layer of glass material 402. In some embodiments, $T_5$ may be approximately 3 microns and $T_6$ may be approximately 2 microns.

The number of layers of conductive traces 206 may vary depending on factors beyond the scope of the disclosure. In some embodiments, the layers may extend partially through the thickness of interposer structure 102; conductive traces 206 may be conductively coupled to TGV 134 suitably. In some embodiments (not shown shown), the layers in some portions of interposer structure 102 may extend through the thickness of interposer structure 102 between sides 103 and 119. In some embodiments, conductive structures 136 may extend partially through the thickness in some portions of interposer structure 102 and entirely through the thickness in some other portions of interposer structure 102. Spacing between conductive traces 206 and width of conductive traces 206 in any one layer may vary according to the thickness of the respective conductive traces 206 in the same layer as described in more detail in reference to FIG. 2.

Figure 5A:
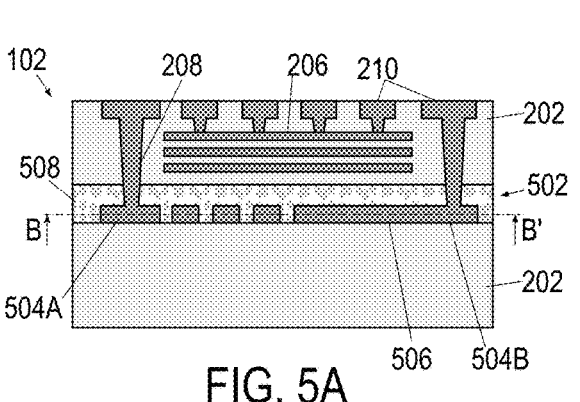
FIG. 5A is a schematic cross-sectional view of a portion of a passive component in an example microelectronic assembly according to some other embodiments of the present disclosure.

FIG. 5A is a schematic cross-sectional view of a portion of a passive component in an example microelectronic assembly 100 according to some embodiments of the present disclosure. In various embodiments, interposer structure 102 may include passive components, such as capacitors (not shown), and inductor 502. Inductor 502 may have a spiral shape and may be disposed at any suitable location in interposer structure 102. In the embodiment shown, inductor 502 is located partially through the thickness of interposer structure 102, between sides 103 and 119. Inductor 502 may comprise bond-pads 504, for example, 504A and 504B, conductively coupled by conductive vias to side 119 of interposer structure 102. A magnetic material 508 may be disposed around conductive trace 506 to enable functionalities of an inductor. Magnetic material 508 may comprise any suitable magnetic material known in the art for use in thin film inductors, such as cobalt alloys and magnesium alloys.

Figure 5B:
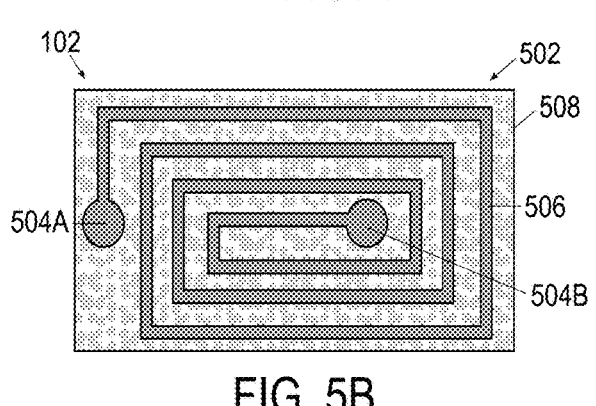
FIG. 5B is a schematic top view of the portion of microelectronic assembly of FIG. 5A.

FIG. 5B is a schematic top view of inductor 502 of FIG. 5A, along axis BB'. Conductive trace 506 may form a spiral (e.g., coiled) shape between bond-pads 504A and 504B, with a plurality of planar coils. A plurality of such inductor 502 may be provisioned in interposer structure 102 within the broad scope of the embodiments. In some embodiments, such plurality of inductor 502 may be coplanar; in other embodiments, inductors 502 may be provisioned in different layers in interposer structure 102.

Figure 6:
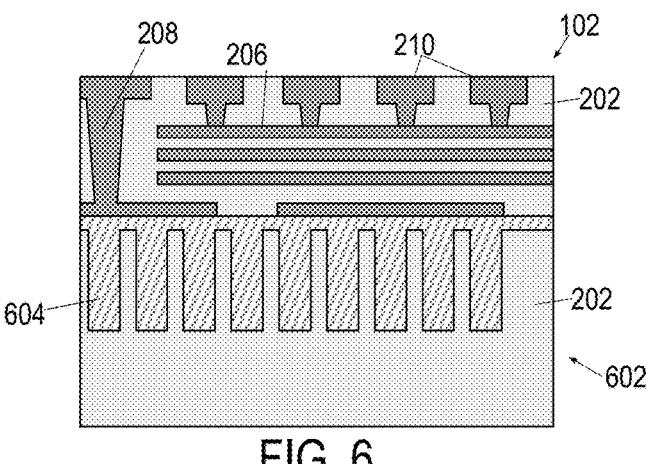
FIG. 6 is a schematic cross-sectional view of a portion of a passive component in an example microelectronic assembly according to some other embodiments of the present disclosure.

FIG. 6 is a schematic cross-sectional view of a portion of another passive component in an example microelectronic assembly 100 according to some other embodiments of the present disclosure. In the embodiment shown, the passive component includes an array of capacitors 602. Capacitor 602 can include any suitable type of capacitors that are compatible with thin film or CMOS process operations, including metal-insulator-metal capacitors, or deep trench capacitors 604, as shown in the figure. In the figure, deep trench capacitors 604 are shown in a representational form, without structural details, such as the conductor plates and capacitor dielectric between the conductor plates, merely for ease of illustration. Any suitable size, shape, and type of capacitors 602 may be included in interposer structure 102 within the broad scope of the embodiments. Capacitor 602 may be disposed at any suitable location in interposer structure 102. In the embodiment shown, capacitor 602 is located partially through the thickness of interposer structure 102, between sides 103 and 119. In some embodiments, capacitor 602 may be conductively coupled to bond-pad 210 on side 119 by conductive via 208. In other embodiments (not shown), capacitor 602 may be conductively coupled to another bond-pad on side 103 by TGV 134.

Figures 7A, 7B, 8:
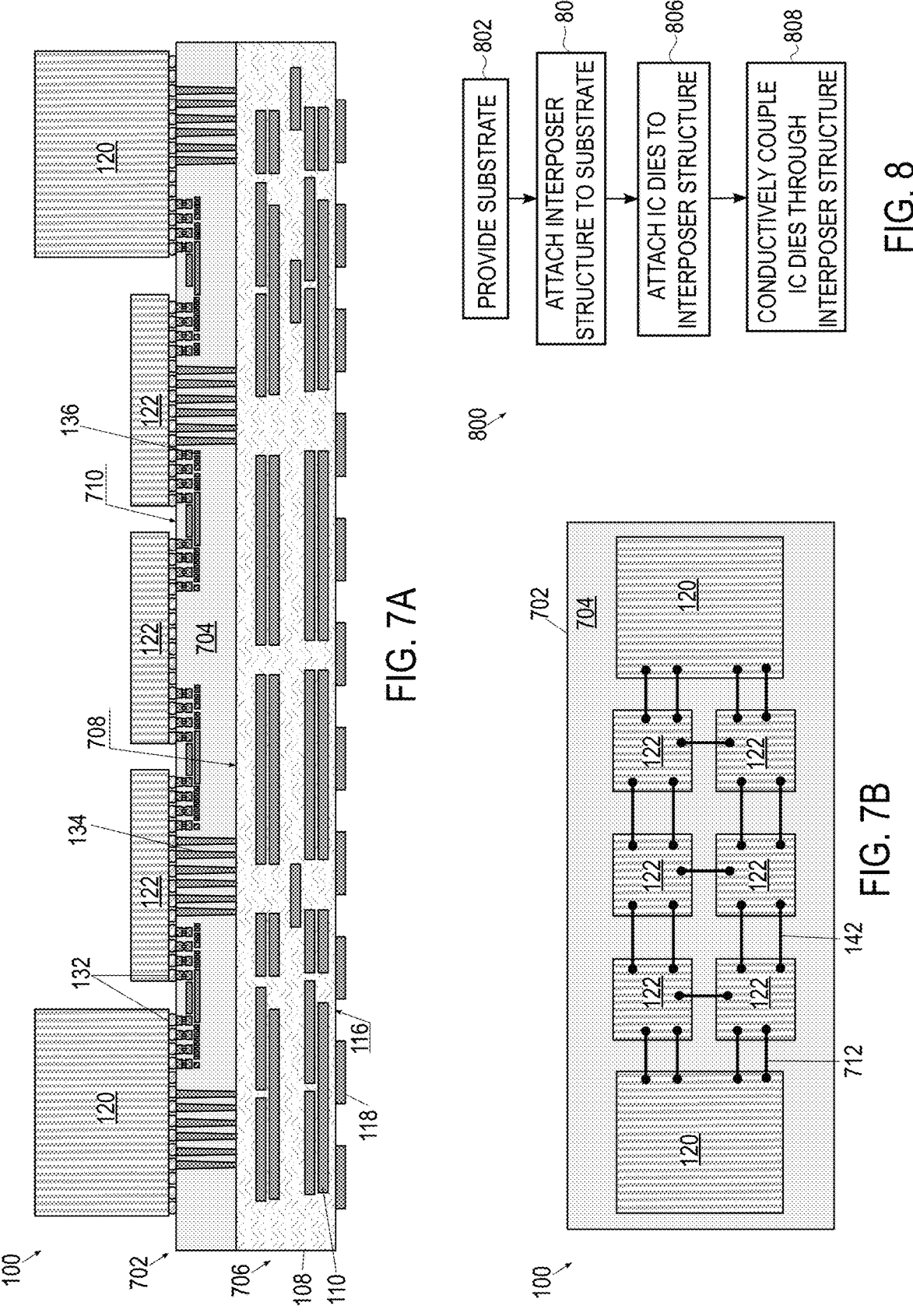
FIG. 7A is a schematic cross-sectional view of another example microelectronic assembly according to some embodiments of the present disclosure.
FIG. 7B is a schematic top view of the microelectronic assembly of FIG. 7A.
FIG. 8 is a simplified flow diagram illustrating various operations that may be associated with manufacturing an example microelectronic assembly, according to various embodiments.

FIG. 7A is a schematic cross-sectional view of another example microelectronic assembly according to some embodiments of the present disclosure. Microelectronic assembly 100 comprises a package substrate 702, including an interposer layer 704 comprising glass. Examples of glass materials are listed in reference to interposer 102 of FIG. 1. Package substrate 702 further comprises a substrate layer 706 comprising organic dielectric material 108 attached along a common contacting interface 708 to interposer layer 704. In some embodiments, substrate layer 706 may be built over interposer layer 704. In other embodiments, substrate layer 706 may be attached using a suitable adhesive to interposer layer 704. In various embodiments, interposer layer 704 is substantially similar in structure to interposer 102 of FIG. 1 except that interposer layer 704 occupies an entire surface of substrate layer 706. In addition, interposer layer 704 does not have a free side 119 as interposer 102 of FIG. 1 but is attached along a common contacting interface 708 with substrate layer 706. Note also that conductive structures 136 and passive components in interposer layer 704 are substantially identical in various embodiments to the structures shown and described in reference to FIGS. 2-6.

In various embodiments, substrate layer 706 is substantially similar in structure to substrate 104 of FIG. 1 except that substrate layer 706 does not have a free surface 106 as substrate 104 but is attached along a common contacting interface 708 with interposer layer 704. Conductive structures 136 in interposer layer 704 may be conductively coupled to conductive structures 110 in substrate layer 706 by TGVs 134 in interposer layer 704. Note that substrate layer 706 may have suitable bond-pads and other conductive elements to facilitate conductive coupling with interposer layer 704; such features are not shown merely for ease of illustration. In addition, passive components such as inductors (e.g., 502) and capacitors (e.g., 602) may be provisioned in interposer layer 704 and/or substrate layer 706 suitably. A person with ordinary skill in the art would reasonably understand that such features, although not shown or labeled, may be provisioned in package substrate 702 to enable electrical functionality of microelectronic assembly 100.

IC dies 120, 122 may be coupled to side 710 of interposer layer 704 by interconnects 132. In some such embodiments, bridge dies 124 may be absent. Lateral coupling between IC dies 120 and 122 may be through conductive pathways in conductive structures 136 of interposer layer 102. IC dies 120, 122 may be coupled to conductive structures 110 in substrate layer 706 by TGVs 134.

FIG. 7B is a schematic top view of example microelectronic assembly 100 of FIG. 7A. Note that only a few components are shown; such is merely for ease of illustration and is not intended as a limitation. Any number of components (e.g., IC dies) may be included in microelectronic assembly 100 within the broad scope of the embodiments. IC die 120 may be coupled by a conductive pathway 712 through interposer layer 704 to IC die 122. Note that conductive pathway 712 may comprise numerous conductive traces, conductive vias and more than one of interconnects 132 in various embodiments. Conductive pathway 712 shown is merely conceptually representational and is not intended to be an accurate physical or geometric representation. Conductive pathway 712 may include interconnects 132 between IC dies 120, 122 and interposer layer 704, and conductive structures 136 in interposer layer 704. IC dies 122 on interposer layer 704 may be conductively coupled by conductive pathway 142 as described in reference to FIG. 1B. In some embodiments, conductive pathways 712 and 142 may be optical waveguides, enabling optical communication between IC dies 120 and 122 or between two IC dies 122. Note that although conductive pathways 712 and 142 are shown between adjacent IC dies, such conductive pathways may extend to non-adjacent IC dies as well within the broad scope of the embodiments. For example, two of IC dies 120 may be conductively coupled across IC dies 122 (and other components not shown in the figure) by suitable conductive pathways in interposer layer 704.

In various embodiments, any of the features discussed with reference to any of FIGS. 1-7 herein may be combined with any other features to form a package with one or more IC dies as described herein. For example, in some microelectronic assemblies, some IC dies may be coupled by interconnects having solder and other IC dies may be coupled by non-solder bonds. Some such combinations are described above, but, in various embodiments, further combinations and modifications are possible. Various different embodiments described in different figures may be combined suitably based on particular needs within the broad scope of the embodiments.

Example Methods

FIG. 8 is a schematic flow diagram of example operations 800 that may be associated with manufacture of microelectronic assembly 100 according to some embodiments of the present disclosure. At 802, substrate 104 may be provided, substrate 104 comprising a plurality of layers of conductive structures 110 (e.g., traces and vias) in organic dielectric material 108. In some embodiments (e.g., as described in reference to FIG. 1), substrate 104 may comprise core 112; in other embodiments (e.g., as described in reference to FIG. 7), substrate 104 may not comprise core 112. Substrate 104 may be manufactured using standard (e.g., known) processes with conductive structures 110 patterned according to particular needs, for example, based on various functionalities provisioned in microelectronic assembly 100.

At 804, interposer structure 102 comprising glass may be attached to substrate 104. In various embodiments, interposer structure 102 may be provisioned with TGVs 134 and conductive structures 136 before attaching to substrate 104. Forming TGVs 134 and conductive structures 136 in interposer structure 102 may be according to known processes, for example, laser drilling, electroplating, sequential deposition of silicon oxide, carbon-doped silicon oxide, silicon nitride, etc., as described in reference to the embodiments of FIGS. 2-4 based on particular needs. In some embodiments, for example, as described in reference to FIG. 1, interposer structure 102 may be attached to substrate 104 by conductive interconnects 130. In some such embodiments, interposer structure 102 may be conductively coupled to bridge dies 124 embedded in organic dielectric material 108 of substrate 104. In some other embodiments, for example, as described in reference to FIG. 7, attaching interposer structure 102 to substrate 104 comprises building substrate 104 on an exposed surface of interposer structure 102 such that a substrate layer is formed over an interposer layer. In some other embodiments, for example, as described in reference to FIG. 7, attaching interposer structure 102 comprises using an adhesive to attach substrate 104 to interposer structure 102.

At 806, a plurality of IC dies 122 may be attached to interposer structure 102 by interconnects 132. In some embodiments, another plurality of IC dies 120 may also be attached to interposer structure 102 by interconnects 132. In some embodiments, plurality of IC dies 120 may further be attached to substrate 104 by interconnects 126. Some of IC dies 120 in such embodiments may also be coupled to bridge dies 124 in substrate 104 by interconnects 128.

At 808, plurality of IC dies 122 may be conductively coupled to each other through conductive structures 136 in interposer structure 102. In some embodiments, for example, as described in reference to FIG. 7, IC dies 120 may also be coupled to IC dies 122 by conductive structures 136 in interposer structure 102. In some other embodiments, IC dies 120 not attached directly to interposer structure 102 may be conductively coupled to IC dies 122 attached to interposer structure 102 by way of TGVs 134, conductive interconnects 128, 130, and bridge dies 124.

Although FIG. 8 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIG. 8 may be modified in accordance with the present disclosure to fabricate others of microelectronic assembly 100 disclosed herein. Although various operations are illustrated in FIG. 8 once each, the operations may be repeated as often as desired. For example, one or more operations may be performed in parallel to manufacture and test multiple microelectronic assemblies substantially simultaneously. In another example, the operations may be performed in a different order to reflect the structure of a particular microelectronic assembly in which one or more substrates or other components as described herein may be included.

Furthermore, the operations illustrated in FIG. 8 may be combined or may include more details than described. For example, the operations may be modified suitably without departing from the scope of the disclosure for IC dies that do not have a semiconductor substrate, but rather, are fabricated on other materials, such as glass or ceramic materials. Still further, the various operations shown and described may further include other manufacturing operations related to fabrication of other components of the microelectronic assemblies described herein, or any devices that may include the microelectronic assemblies as described herein. For example, the operations not shown in FIG. 8 may include various cleaning operations, additional surface planarization operations, operations for surface roughening, operations to include barrier and/or adhesion layers as desired, and/or operations for incorporating microelectronic assemblies as described herein in, or with, an IC component, a computing device, or any desired structure or device.

Example Devices and Components

Figure 9:
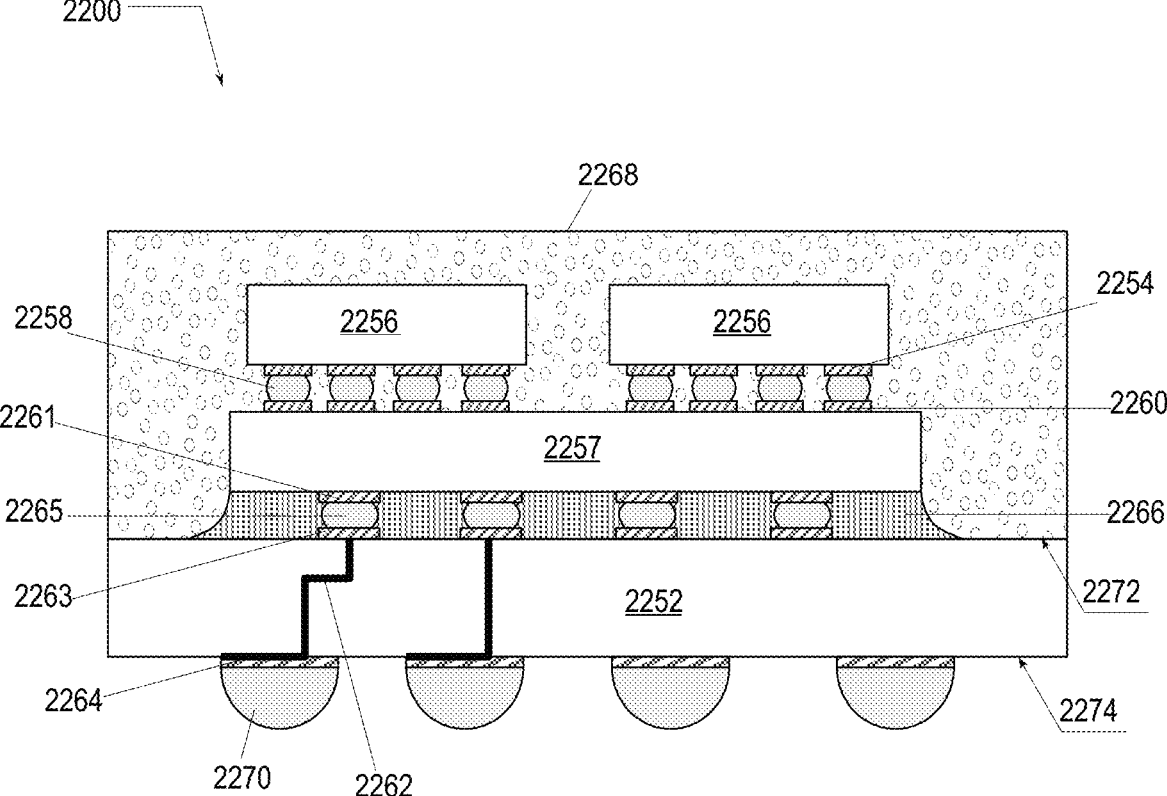
FIG. 9 is a cross-sectional view of a device package that includes one or more microelectronic assemblies in accordance with any of the embodiments disclosed herein.
Figure 11:
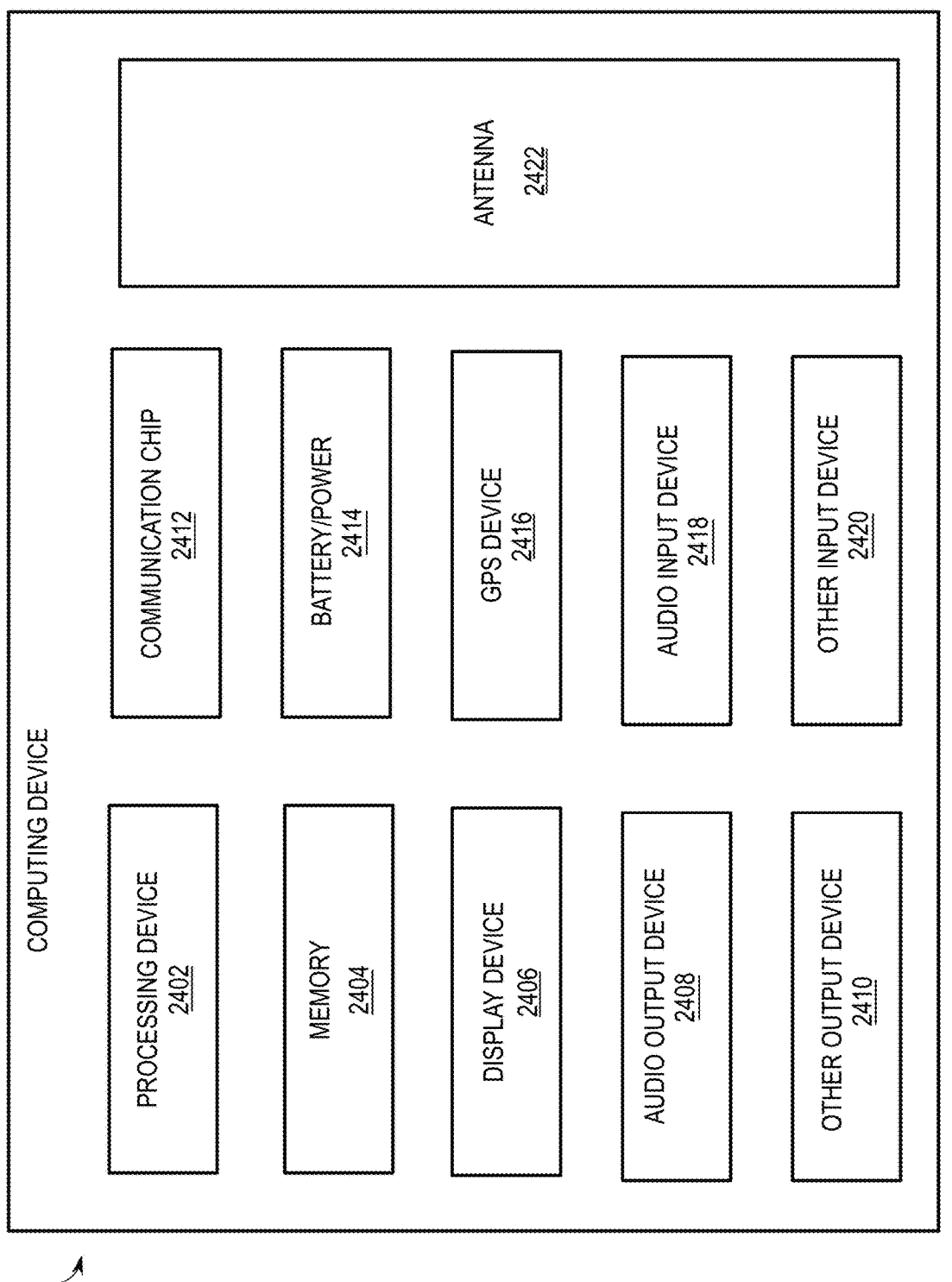
FIG. 11 is a block diagram of an example computing device that includes one or more microelectronic assemblies in accordance with any of the embodiments disclosed herein.

The packages disclosed herein, e.g., any of the embodiments shown in FIGS. 1-8 or any further embodiments described herein, may be included in any suitable electronic component. FIGS. 9-11 illustrate various examples of packages, assemblies, and devices that may be used with or include any of the IC packages as disclosed herein.

FIG. 9 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 10.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 10 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 9.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 9. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group Ill-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 11 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 9). In yet another example, any one or more of the components of computing device 2400 may include an IC device assembly 2300 (e.g., as shown in FIG. 10).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

Example 1 provides a microelectronic assembly (e.g., 100, FIG. 1), comprising: an interposer structure (e.g., 102) comprising glass; a substrate (e.g., 104) comprising organic dielectric material, the substrate coupled to a first side (e.g., 103) of the interposer structure; and a plurality of IC dies (e.g., 120, 122, 124), in which: a first IC die (e.g., 120) in the plurality of IC dies is coupled to the substrate by first interconnects (e.g., 126), a second IC die (e.g., 124) in the plurality of IC dies is embedded in the organic dielectric material of the substrate, the second IC die is coupled to the first IC die by second interconnects (e.g., 128), the second IC die is coupled to the first side of the interposer structure by third interconnects (e.g., 130), and a third IC die (e.g., 122) in the plurality of IC dies is coupled to a second side (e.g., 119) of the interposer structure by fourth interconnects (e.g., 132), the second side of the interposer structure being opposite the first side of the interposer structure.

Example 2 provides the microelectronic assembly of example 1, in which the third IC die is conductively coupled to the second IC die by TGVs (e.g., 134) in the interposer structure.

Example 3 provides the microelectronic assembly of any one of examples 1-2, in which: a fourth IC die in the plurality of IC dies is coupled to the second side of the interposer structure, the fourth IC die is conductively coupled to the third IC die by conductive structures (e.g., 136) in the interposer structure.

Example 4 provides the microelectronic assembly of example 3, in which the conductive structures in the interposer structure comprise optical waveguides.

Example 5 provides the microelectronic assembly of example 3, in which the conductive structures in the interposer structure comprise (e.g., FIGS. 2-4): conductive bond-pads (e.g., 210); a plurality of layers of conductive traces (e.g., 206); and conductive vias (e.g., 208) coupling the conductive traces and the conductive bond-pads in different layers.

Example 6 provides the microelectronic assembly of example 5, in which (e.g., FIG. 2) the conductive traces proximate to the first side of the interposer structure is approximately of same thickness as the conductive traces proximate to the second side of the interposer structure.

Example 7 provides the microelectronic assembly of any one of examples 5-6, in which: the conductive traces are approximately between 2 microns and 3 microns thick, line spacing between the conductive traces varies approximately between 1 micrometer and 20 micrometers, and the conductive vias have via diameters between 2 micrometers and 50 micrometers.

Example 8 provides the microelectronic assembly of example 5, in which (e.g., FIG. 3) the conductive traces proximate to the first side of the interposer structure is thinner than the conductive traces proximate to the second side of the interposer structure.

Example 9 provides the microelectronic assembly of example 5, in which (e.g., FIG. 3) the conductive vias proximate to the first side of the interposer structure are smaller than the conductive vias proximate to the second side of the interposer structure.

Example 10 provides the microelectronic assembly of any one of examples 5-6, in which (e.g., FIG. 4): the interposer structure comprises alternating layers of a first glass material (e.g., 202) and a second glass material (e.g., 402), the conductive vias are in the first glass material, and the conductive traces are in the second glass material.

Example 11 provides the microelectronic assembly of example 10, in which the layers of the first glass material is approximately 2 microns thick, and the layers of the second glass material is approximately 3 microns thick.

Example 12 provides the microelectronic assembly of example 10, in which: the first glass material comprises silicon and oxygen, and the second glass material comprises carbon, silicon, and oxygen.

Example 13 provides the microelectronic assembly of any one of examples 5-12, in which: a layer (e.g., 204) comprising silicon and nitrogen is between the conductive bond-pads and the conductive traces, and a subset of the conductive vias is in the layer comprising silicon and nitrogen.

Example 14 provides the microelectronic assembly of example 13 in which: the layer comprising silicon and nitrogen is approximately between 0.4 microns and 2.7 microns.

Example 15 provides the microelectronic assembly of any one of examples 1-14, in which the first side of the interposer structure and the second side of the interposer structure have respective layers comprising silicon and nitrogen.

Example 16 provides the microelectronic assembly of example 15 in which: the respective layers comprising silicon and nitrogen are approximately between 0.4 microns and 2.7 microns.

Example 17 provides the microelectronic assembly of any one of examples 1-16, in which (e.g., FIGS. 5-6) the interposer structure further comprises passive electronic components, including inductors and capacitors.

Example 18 provides the microelectronic assembly of example 17, in which the inductor is a spiral inductor.

Example 19 provides the microelectronic assembly of example 17, in which the capacitors comprise an array of deep trench capacitors.

Example 20 provides the microelectronic assembly of any one of examples 1-19, in which the substrate comprises a plurality of layers of conductive traces (e.g., 110) in the organic dielectric material (e.g., 108).

Example 21 provides the microelectronic assembly of example 20, in which the substrate further comprises a core (e.g., 112) with through-hole vias (THVs) (e.g., 114) through the core.

Example 22 provides the microelectronic assembly of example 21, in which the core comprises fiber reinforced epoxy material.

Example 23 provides the microelectronic assembly of any one of examples 21-22, in which the plurality of layers of conductive traces in the organic dielectric material are on either side of the core.

Example 24 provides the microelectronic assembly of any one of examples 1-23, in which: the substrate has a first side (e.g., 106) and an opposing second side (e.g., 116), the first side of the interposer structure is coupled to the first side of the substrate, and the substrate further comprises bond-pads (e.g., 118) on the second side.

Example 25 provides the microelectronic assembly of any one of examples 1-24, in which: the first IC die comprises memory circuits, the second IC die comprises bridge circuits, and the third IC die comprises compute circuits.

Example 26 provides the microelectronic assembly of any one of examples 1-25, in which: the interposer structure comprises active circuit elements.

Example 27 provides a microelectronic assembly (e.g., 100, FIG. 7), comprising: a package substrate (e.g., 702) including: an interposer layer (e.g., 704) comprising glass; and a substrate layer (e.g., 706) on a first side (e.g., 703) of the interposer layer, the substrate layer comprising organic dielectric material; and a plurality of IC dies (e.g., 120, 122) coupled to a second side (e.g., 119) of the interposer layer by interconnects (e.g., 132), the second side being opposite the first side, in which: the IC dies in the plurality of IC dies are conductively coupled to each other by first conductive structures in the interposer layer, the substrate layer comprises second conductive structures in the organic dielectric material, and TGVs in the interposer layer conductively couple the plurality of IC dies to the second conductive structures.

Example 28 provides the microelectronic assembly of example 27, in which the first conductive structures in the interposer layer comprise (e.g., FIGS. 2-4): conductive bond-pads; a plurality of layers of conductive traces; and conductive vias coupling the conductive traces and the conductive bond-pads in different layers.

Example 29 provides the microelectronic assembly of example 28, in which (e.g., FIG. 2) the conductive traces proximate to the first side of the interposer layer is approximately of same thickness as the conductive traces proximate to the second side of the interposer layer.

Example 30 provides the microelectronic assembly of example 28, in which (e.g., FIG. 3) the conductive traces proximate to the first side of the interposer layer is thinner than the conductive traces proximate to the second side of the interposer layer.

Example 31 provides the microelectronic assembly of example 28, in which (e.g., FIG. 3) the conductive vias proximate to the first side of the interposer layer are smaller than the conductive vias proximate to the second side of the interposer layer.

Example 32 provides the microelectronic assembly of any one of examples 28-31, in which (e.g., FIG. 4): the interposer layer comprises alternating layers of a first glass material (e.g., 202) and a second glass material (e.g., 402), the conductive vias are in the first glass material, and the conductive traces are in the second glass material.

Example 33 provides the microelectronic assembly of example 32, in which: the first glass material comprises silicon and oxygen, and the second glass material comprises carbon, silicon, and oxygen.

Example 34 provides the microelectronic assembly of any one of examples 28-33, in which: a layer (e.g., 204) comprising silicon and nitrogen is between the conductive bond-pads and the conductive traces, and a subset of the conductive vias is in the layer comprising silicon and nitrogen.

Example 35 provides the microelectronic assembly of any one of examples 27-34, in which the first side of the interposer layer and the second side of the interposer layer have respective layers comprising silicon and nitrogen.

Example 36 provides the microelectronic assembly of any one of examples 27-35, in which (e.g., FIGS. 5-6) the interposer layer further comprises passive electronic components, including inductors and capacitors.

Example 37 provides the microelectronic assembly of example 36, in which the inductor is a spiral inductor.

Example 38 provides the microelectronic assembly of any one of examples 36-37, in which the capacitors comprise an array of deep trench capacitors.

Example 39 provides the microelectronic assembly of any one of examples 27-38, in which the second conductive structures in the substrate layer comprises a plurality of layers of conductive traces in the organic dielectric material (e.g., 108).

Example 40 provides the microelectronic assembly of any one of examples 27-39, in which a first subset of the plurality of IC dies comprises memory circuits, and a second subset of the plurality of IC dies comprises compute circuits.

Example 41 provides a method, comprising: providing a first structure comprising a plurality of layers of conductive traces in an organic dielectric material; attaching a second structure comprising glass to the first structure; attaching a plurality of IC dies to the second structure; and conductively coupling the plurality of IC dies through the second structure.

Example 42 provides the method of example 41, in which the second structure is attached by conductive interconnects to the first structure.

Example 43 provides the method of any one of examples 41-42, further comprising: attaching another plurality of IC dies to the first structure; and conductively coupling the another plurality of IC dies to the plurality of IC dies through the first structure.

Example 44 provides the method of example 43, in which: conductively coupling the another plurality of IC dies to the plurality of IC dies comprises coupling the another plurality of IC dies to bridge dies embedded in the organic dielectric material of the first structure, and the bridge dies embedded in the organic dielectric material of the first structure are coupled to the second structure.

Example 45 provides the method of example 43, in which conductively coupling the another plurality of IC dies to the plurality of IC dies comprises providing TGVs in the second structure.

Example 46 provides the method of any one of examples 41-45, in which attaching the second structure comprises building the first structure on an exposed surface of the second structure such that a substrate layer covers substantially the exposed surface of an interposer layer underneath.

Example 47 provides the method of any one of examples 41-45, in which attaching the second structure comprises attaching the second structure to the first structure by an adhesive.

Example 48 provides the method of any one of examples 41-47, in which the plurality of IC dies is attached to the second structure by conductive interconnects.

Example 49 provides the method of any one of examples 41-48, further comprising conductively coupling the plurality of IC dies to the first structure.

Example 50 provides the method of example 49, in which conductively coupling the plurality of IC dies to the first structure comprises providing TGVs in the second structure.

Example 51 provides a microelectronic assembly, comprising: a package substrate; a first plurality of IC dies coupled to the package substrate; an interposer structure coupled to the package substrate laterally adjacent to the first plurality of IC dies; and a second plurality of IC dies coupled to the interposer structure on a side of the interposer structure opposite the package substrate, in which: the interposer structure is conductively coupled to the first plurality of IC dies through the package substrate, the interposer structure comprises glass, a plurality of layers of conductive traces and TGVs in the glass, and individual IC dies of the second plurality of IC dies are conductively coupled by conductive traces in the interposer structure.

Example 52 provides the microelectronic assembly of example 51, in which the interposer structure is conductively coupled to the first plurality of IC dies through a third plurality of IC dies embedded in the package substrate.

Example 53 provides the microelectronic assembly of example 52, in which individual IC dies of the third plurality of IC dies are between adjacent sides of the first plurality of IC dies and the interposer structure.

Example 54 provides the microelectronic assembly of any one of examples 52-53, in which the package substrate comprises a plurality of layers of conductive traces in an organic dielectric material.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
an interposer structure comprising glass;
a substrate comprising organic dielectric material, the substrate coupled to a first side of the interposer structure; and
a plurality of IC dies,
wherein:
a first IC die in the plurality of IC dies is directly coupled to the substrate by first interconnects,
a second IC die in the plurality of IC dies is embedded in the organic dielectric material of the substrate, the second IC die is directly coupled to the first IC die
by second interconnects,
the second IC die is coupled to the first side of the
interposer structure by third interconnects, and
a third IC die in the plurality of IC dies is coupled to a
second side of the interposer structure by fourth
interconnects, the second side of the interposer struc-
ture being opposite the first side of the interposer
structure.

2. The microelectronic assembly of claim 1, wherein the
third IC die is conductively coupled to the second IC die by
through-glass vias (TGVs) in the interposer structure.

3. The microelectronic assembly of claim 1, wherein:
a fourth IC die in the plurality of IC dies is coupled to the
second side of the interposer structure,
the fourth IC die is conductively coupled to the third IC
die by conductive structures in the interposer structure.

4. The microelectronic assembly of claim 3, wherein the
conductive structures in the interposer structure comprise:
conductive bond-pads;
a plurality of layers of conductive traces; and
conductive vias coupling the conductive traces and the
conductive bond-pads in different layers.

5. The microelectronic assembly of claim 4, wherein:
the interposer structure comprises alternating layers of a
first glass material and a second glass material,
the conductive vias are in the first glass material, and
the conductive traces are in the second glass material.

6. The microelectronic assembly of claim 1, wherein the
interposer structure further comprises passive electronic
components.

7. The microelectronic assembly of claim 1, wherein the
substrate comprises a plurality of layers of conductive traces
in the organic dielectric material.

8. A microelectronic assembly, comprising:
an interposer structure comprising glass;
a substrate comprising organic dielectric material, the
substrate coupled to a first side of the interposer struc-
ture; and
a plurality of IC dies,
wherein:
a first IC die in the plurality of IC dies is coupled to the
substrate by first interconnects,
a second IC die in the plurality of IC dies is embedded
in the organic dielectric material of the substrate,
the second IC die is coupled to the first IC die by second
interconnects,
the second IC die is coupled to the first side of the
interposer structure by third interconnects,
a third IC die in the plurality of IC dies is coupled to a
second side of the interposer structure by fourth
interconnects, the second side of the interposer struc-
ture being opposite the first side of the interposer
structure,
a fourth IC die in the plurality of IC dies is coupled to
the second side of the interposer structure,
the fourth IC die is conductively coupled to the third IC
die by conductive structures in the interposer struc-
ture, and
wherein the conductive structures in the interposer struc-
ture comprise optical waveguides.

9. A microelectronic assembly, comprising:
an interposer structure comprising glass;
a substrate comprising organic dielectric material, the
substrate coupled to a first side of the interposer struc-
ture; and
a plurality of IC dies, wherein:
a first IC die in the plurality of IC dies is coupled to the
substrate by first interconnects,
a second IC die in the plurality of IC dies is embedded
in the organic dielectric material of the substrate,
the second IC die is coupled to the first IC die by second
interconnects,
the second IC die is coupled to the first side of the
interposer structure by third interconnects,
a third IC die in the plurality of IC dies is coupled to a
second side of the interposer structure by fourth
interconnects, the second side of the interposer struc-
ture being opposite the first side of the interposer
structure,
a fourth IC die in the plurality of IC dies is coupled to
the second side of the interposer structure,
the fourth IC die is conductively coupled to the third IC
die by conductive structures in the interposer struc-
ture,
the conductive structures in the interposer structure
comprise:
conductive bond-pads;
a plurality of layers of conductive traces; and
conductive vias coupling the conductive traces and
the conductive bond-pads in different layers, and
wherein the conductive traces proximate to the first side
of the interposer structure is approximately of same
thickness as the conductive traces proximate to the
second side of the interposer structure.

10. A microelectronic assembly, comprising:
an interposer structure comprising glass;
a substrate comprising organic dielectric material, the
substrate coupled to a first side of the interposer struc-
ture; and
a plurality of IC dies,
wherein:
a first IC die in the plurality of IC dies is coupled to the
substrate by first interconnects,
a second IC die in the plurality of IC dies is embedded
in the organic dielectric material of the substrate,
the second IC die is coupled to the first IC die by second
interconnects,
the second IC die is coupled to the first side of the
interposer structure by third interconnects,
a third IC die in the plurality of IC dies is coupled to a
second side of the interposer structure by fourth
interconnects, the second side of the interposer struc-
ture being opposite the first side of the interposer
structure,
a fourth IC die in the plurality of IC dies is coupled to
the second side of the interposer structure,
the fourth IC die is conductively coupled to the third IC
die by conductive structures in the interposer struc-
ture,
the conductive structures in the interposer structure
comprise:
conductive bond-pads;
a plurality of layers of conductive traces; and
conductive vias coupling the conductive traces and
the conductive bond-pads in different layers, and
wherein the conductive traces proximate to the first side
of the interposer structure is thinner than the conductive
traces proximate to the second side of the interposer
structure.

11. A microelectronic assembly, comprising:
a package substrate;

a first plurality of IC dies coupled to the package substrate;

an interposer structure coupled to the package substrate laterally adjacent to the first plurality of IC dies; and a second plurality of IC dies coupled to the interposer structure on a side of the interposer structure opposite the package substrate, wherein:

the interposer structure is conductively coupled to the first plurality of IC dies through the package substrate, the interposer structure comprises glass, a plurality of layers of conductive traces and through-glass vias (TGVs) in the glass, individual IC dies of the second plurality of IC dies are conductively coupled by conductive traces in the interposer structure, and the interposer structure is conductively coupled to the first plurality of IC dies through a third plurality of IC dies embedded in the package substrate.

12. The microelectronic assembly of claim 11, wherein individual IC dies of the third plurality of IC dies are between adjacent sides of the first plurality of IC dies and the interposer structure.

13. The microelectronic assembly of claim 11, wherein the package substrate comprises a plurality of layers of conductive traces in an organic dielectric material.

\* \* \* \* \*